US007341052B2

(12) United States Patent
Kawakita

(10) Patent No.: US 7,341,052 B2
(45) Date of Patent: Mar. 11, 2008

(54) POWER SWITCHING CONTROL DEVICE FOR ELECTRIC SYSTEMS

(75) Inventor: Haruo Kawakita, Okazaki (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 125 days.

(21) Appl. No.: 11/407,104

(22) Filed: Apr. 20, 2006

(65) Prior Publication Data
US 2006/0244496 A1 Nov. 2, 2006

(30) Foreign Application Priority Data
Apr. 22, 2005 (JP) ............................. 2005-124848

(51) Int. Cl.
F02P 3/05 (2006.01)
F02P 3/055 (2006.01)
H01T 15/00 (2006.01)

(52) U.S. Cl. ................ 123/647; 123/652; 361/253; 327/110

(58) Field of Classification Search ............. 123/647, 123/652; 327/110; 361/253
See application file for complete search history.

(56) References Cited

U.S. PATENT DOCUMENTS

| 5,558,074 | A | * | 9/1996 | Fukatsu et al. | 123/647 |
|---|---|---|---|---|---|
| 5,642,253 | A | * | 6/1997 | Shreve | 361/152 |
| 5,664,550 | A | * | 9/1997 | Ito et al. | 123/630 |
| 5,781,047 | A | * | 7/1998 | Shreve et al. | 327/110 |
| 6,100,728 | A | * | 8/2000 | Shreve et al. | 327/110 |
| 6,257,215 | B1 | * | 7/2001 | Kaminaga et al. | 123/647 |
| 6,378,514 | B1 | * | 4/2002 | Kaminaga et al. | 123/633 |
| 6,539,929 | B2 | * | 4/2003 | Ito et al. | 123/630 |
| 6,735,065 | B2 | * | 5/2004 | Graf et al. | 361/103 |
| 2004/0011342 | A1 | * | 1/2004 | Fukatsu | 123/630 |
| 2005/0224909 | A1 | * | 10/2005 | Yamaguchi et al. | 257/528 |
| 2005/0269674 | A1 | * | 12/2005 | Kawakita et al. | 257/666 |

* cited by examiner

*Primary Examiner*—Evan Pert
(74) *Attorney, Agent, or Firm*—Nixon & Venderhye P.C.

(57) ABSTRACT

A power switching control device for electric systems such as an ignition device for internal combustion engines has a control circuit IC and a switching IC. A temperature sensor is provided in the switching IC. The control circuit IC is joined to a grounding terminal through a conductive layer provided therebetween. Thus, the substrate potential of the control circuit IC is stabilized to the ground potential so that the temperature sensor is prohibited to operate erroneously due to electromagnetic noise.

12 Claims, 4 Drawing Sheets

POWER SWITCHING CONTROL DEVICE
FOR ELECTRIC SYSTEMS

CROSS REFERENCE TO RELATED APPLICATION

This application is based on and incorporates herein by reference Japanese patent application No. 2005-124848 filed on Apr. 22, 2005.

FEILD OF THE INVENTION

The present invention relates to a power switching control device for electric systems such as an ignition device for internal combustion engines, the power switching control device having a circuit for restricting overheating of a semiconductor switching element.

BACKGROUND OF THE INVENTION

An insulated-gate bipolar transistor (IGBT), which is a semiconductor power switching element, is used in many power switching control devices for electric systems. For instance, it is used in an ignition device for internal combustion engines as disclosed in U.S. Pat. No. 5,664,550 (JP 3,216,972). In this ignition device, the IGBT is turned on and off by a control signal from an electronic control unit for an engine (engine ECU), so that current supply to the primary winding of an ignition coil connected to the IGBT is controlled to control spark discharge of a spark plug. Specifically, the IGBT is turned on and off when the control signal becomes high and low, respectively.

If the control signal from the engine ECU continues to be high too long due to some abnormality, the IGBT continues to be turned on for a long time in and causes overheating. It is therefore necessary to detect the excessive continuation of current supply and prohibit the IGBT from continuing to be turned on, so that the IGBT is protected from breaking down due to overheating.

Various methods are proposed to detect the excessive continuation of current supply. One method is to monitor the control signal. The excessive continuation may be determined when the control signal continues to be high for more than a predetermined time period. Another method is to detect the temperature of the IGBT. The excessive continuation is determined when the IGBT temperature rises to a predetermined temperature.

According to the latter method, the IGBT temperature may be detected based on the temperature characteristic of diodes formed in a switching integrated circuit (IC), in which the IGBT is formed. That is, this method is based on the forward voltage drop of diodes varies with temperature. For instance, an overheat detector circuit is formed with at least one diode and current is supplied to the overheat detector circuit from a current regulator circuit. The excessive continuation of current supply is determined when a terminal voltage of the overheat detector circuit falls below a predetermined voltage. With the detection of IGBT temperature, the IGBT is protected from overheating, which may be caused by not only the excessive continuation of current supply but also other causes. Therefore, it is preferred to determine the excessive continuation based on the IGBT temperature.

If the IGBT is formed as a vertical type power element, electrodes need be connected to both top and bottom faces of the switching IC to detect the IGBT temperature. For instance, the electrodes may be placed on a frame on which the output terminal of the switching IC is formed so that the bottom face of the switching IC may be connected to the frame. A monitor circuit for monitoring the terminal voltage of the overheat detector circuit may be formed in a control circuit IC, which is distanced from a frame forming a current path to the IGBT. That is, the monitor circuit is formed in the control circuit IC, which is formed as a chip different from the switching IC including the IGBT.

When the switching IC and the control circuit IC are formed separately, these ICs must be connected with wires so that the overheat detector circuit and the terminal voltage monitor circuit. This construction is likely to be affected by electromagnetic noise, because the wires have inductive components (L) and capacitive components (c) are formed between the wires and the frame, etc. The electromagnetic noise causes LC resonance with the L components and the C components, thus changing the diode forward voltage drop. As a result, the protective function against overheating is initiated by the overheat detector circuit even when the IGBT temperature is within a normal temperature range. In this case, spark discharging is disabled notwithstanding normal IGBT temperatures. Not only the ignition device for engines but also other electric systems, in which electric power supply is switching-controlled, suffer from the same drawback.

SUMMARY OF THE INVENTION

The present invention is directed to improve a power switching control device for electric systems and, more particularly, to inhibit protective function against erroneous overheating detection.

According to an aspect of the present invention, a power switching control device is constructed with a switching IC and a control circuit IC. The switching IC includes a semiconductor power switching element, which turns on and off supply of current to an electric system. The switching IC further includes a temperature sensor for detecting temperature of the switching element. The control circuit IC is distanced from the switching IC and controls operation of the switching element. The control circuit IC includes an overheat detector circuit for detecting an overheating of the switching IC based on a detection result of the temperature sensor and stops the operation of the switching element upon detection of the overheating. The switching IC and the control circuit IC are connected to each other by bonding wires. A grounding terminal is provided to ground both the switching IC and the control circuit IC. Further, a conductive layer is provided between the control circuit IC and the grounding terminal and joins the control circuit IC to the grounding terminal thereby grounding the control circuit IC.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE EMBODIMENT

Figure 1:
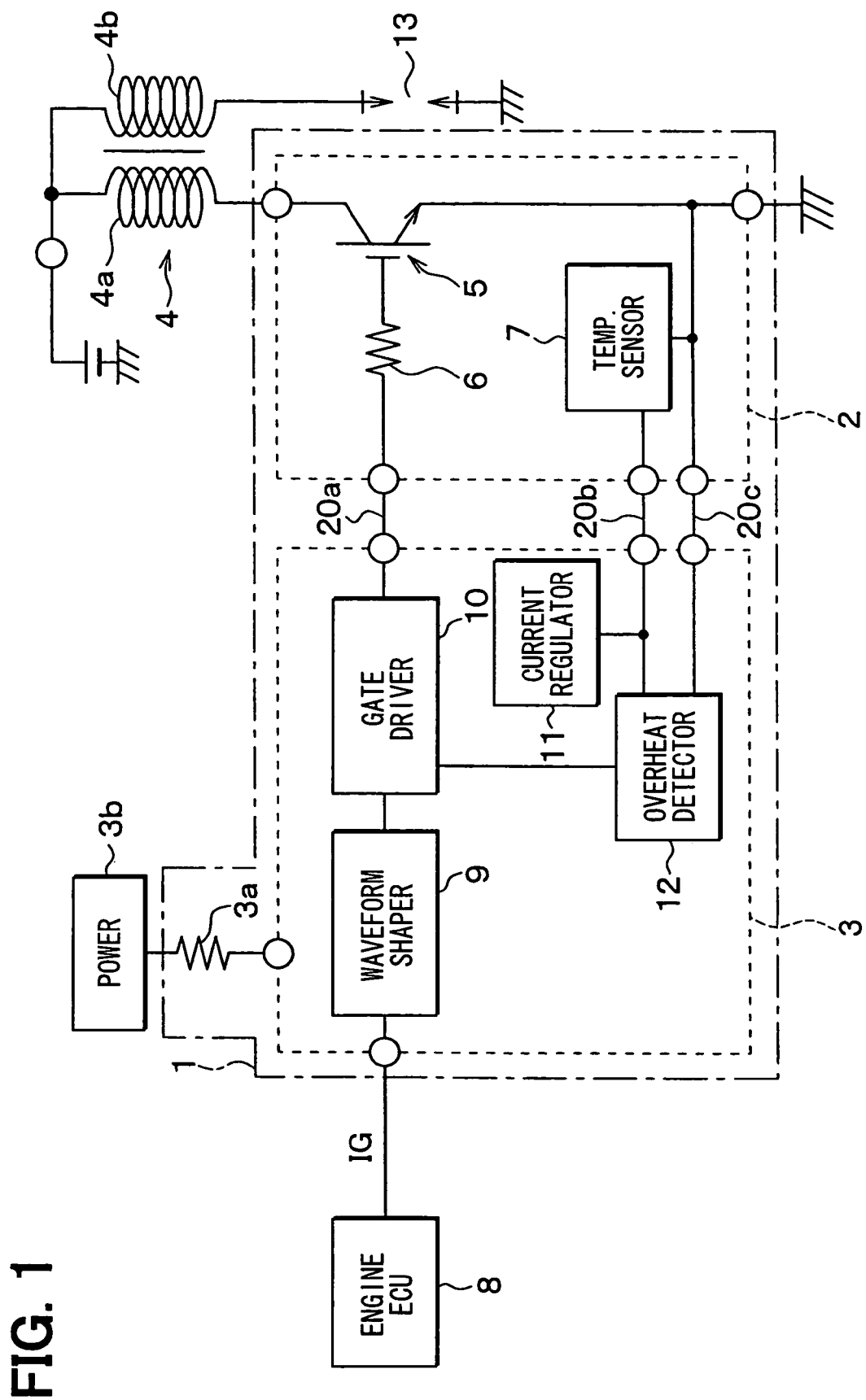
FIG. 1 is an electric circuit diagram of an ignition device according to an embodiment of the present invention.

A power switching control device for electric systems is described with reference to an embodiment, which is constructed as an ignition device 1 for internal combustion engine as shown in FIG. 1.

The ignition device 1 has a switching IC 2 and a control circuit IC 3. The ICs 2 and 3 are formed as separate semiconductor chips from each other and connected to each other through bonding wires 20a, 20b and 20c. The switching IC 2 has an IGBT 5 and a resistor 6 to switching-control current supply to a primary winding 4a of an ignition coil 4. The ignition coil 4 has a secondary winding 4b connected to an engine spark plug 13.

The gate voltage to the IGBT 5 is controlled by a control signal from a control circuit IC 3 through the resistor 6. When the gate voltage becomes high, the IGBT 5 turns on and supplies current to the primary winding 4a. When the gate voltage becomes low, the IGBT 5 turns off and shuts down the current supply.

The switching IC 2 further has a temperature sensor 7. The sensor 7 is constructed with a plurality of polysilicon diodes, which are connected in series and formed, for instance, on a surface of the chip of the switching IC 2. Because the forward voltage of each polysilicon diode varies with its temperature, temperature of the chip and hence of the IGBT 5 is detected by detecting a variation in a terminal voltage of the temperature sensor 7. The low potential side of the temperature sensor 7 is grounded.

The control circuit IC 3 receives an ignition signal IG from an engine ECU 8 at terminal 14c and generates a control signal for the IGBT 5 in the switching IC 2. Electric power is supplied to the control circuit IC 3 through a protective resistor 3a from a power source circuit 3b, so that the control circuit IC 3 is operated with this power.

The control circuit IC 3 has a waveform shaper circuit 9 and a gate driver circuit 10. The shaper circuit 9 shapes the waveform of the ignition signal IG applied thereto and the gate driver circuit 10 generates the gate voltage of the IGBT 5 in response to the shaped ignition signal. This gate voltage is applied to the IGBT 5 through the bonding wire 20a thereby to turn on and off the IGBT 5.

The control circuit IC further has a current regulator circuit 11 and an overheat detector circuit 12. The current regulator circuit 11 supplies electric current regulated to a constant current to the temperature sensor 7 through the bonding wire 20b, so that the temperature sensor 7 operates with this power to detect IGBT temperature. The overheat detector circuit 12 is connected to the terminals of the temperature sensor 7 through the bonding wires 20b and 20c. This detector circuit 12 detects whether the temperature of the switching IC 2 and hence of the IGBT 5 is in an excessive rise or not based on the terminal voltage of the temperature sensor 7. When the temperature is in the excessive rise, the detector circuit 12 generates a latch signal. This signal is applied to the gate driver circuit 10, which responsively stops generating the gate voltage thereby to prohibit IGBT operation.

The overheat detector circuit 12 includes a comparator, which compares the high potential side voltage of the temperature sensor 7 appearing between the bonding wires 20b and 20c with a predetermined reference voltage Vref. This high potential side voltage corresponds to the forward voltage drop of the series-connected diodes forming the temperature sensor 7. When the forward voltage drop becomes smaller than the reference voltage Vref, the comparator generates an overheat signal indicating that the IGBT 5 is in the excessive temperature rise or overheating.

Figure 2:
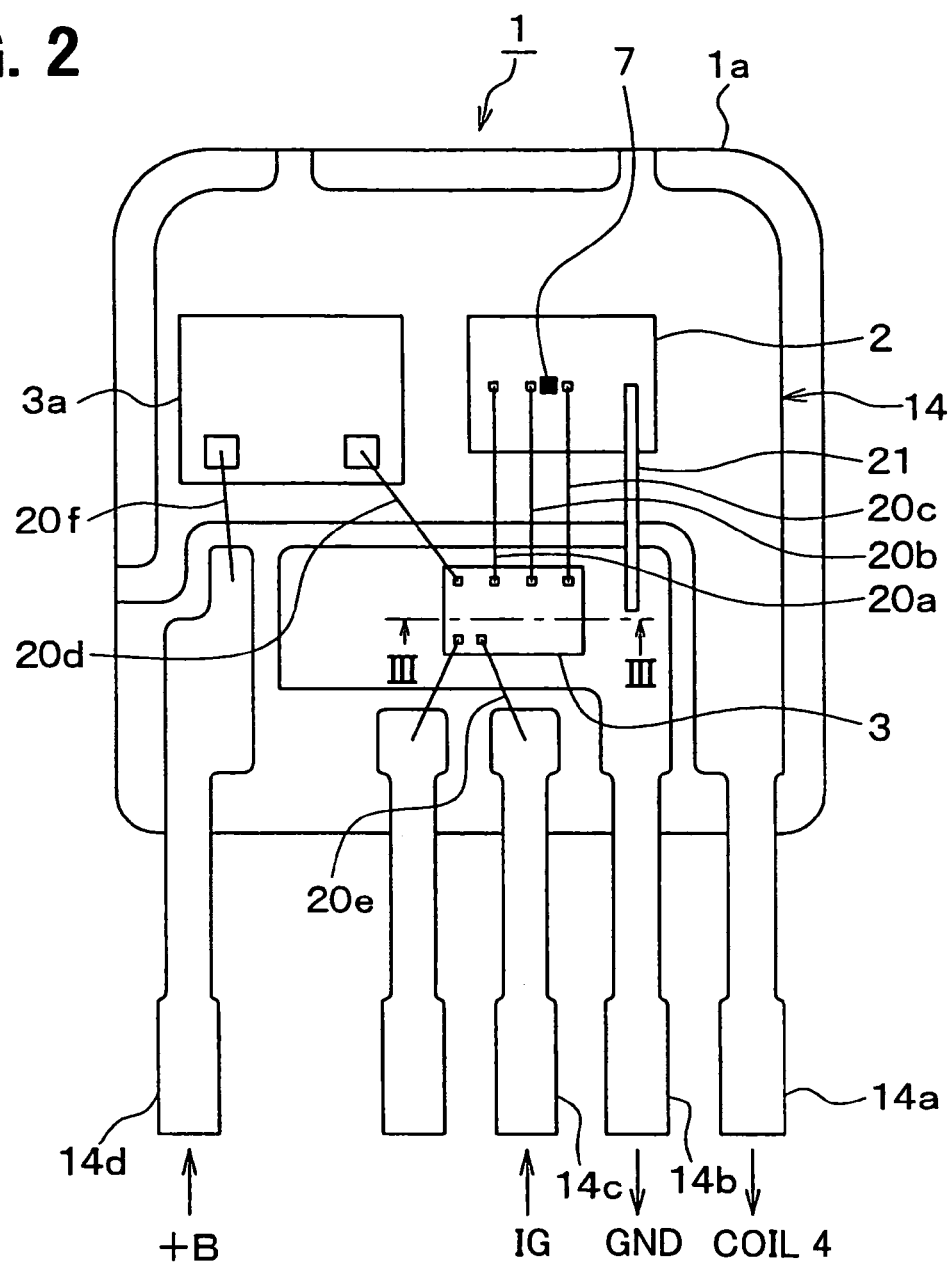
FIG. 2 is a plan view of the ignition device shown in FIG. 1.

As shown in FIG. 2, componets of the ignition device 1 are mounted on respective positions on a lead frame 14, which may be made of a metal plate such as a copper (Cu) plate punched to provide a plurality of terminals. The components are resin-sealed with molding resin 1a.

Figure 3:
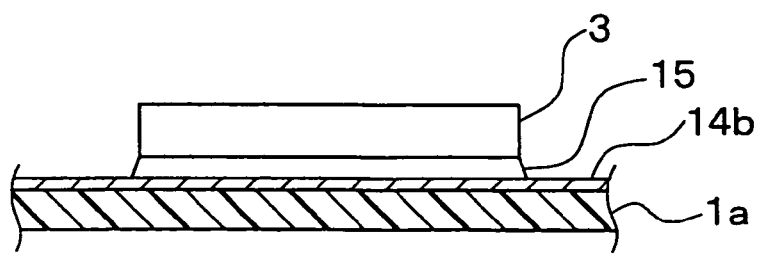
FIG. 3 is a sectional view of the ignition device taken along lines III-III in FIG. 2.

Specifically, the switching IC 2 and the protective resistor 3a are mounted on an output terminal 14a, which is connected to the primary winding 4a of the ignition coil 4. The control circuit IC 3 is mounted on a grounding terminal 14b so that the impedance is stabilized. The IGBT 5 is formed as a vertical power element in the switching IC 2. Therefore, the bottom face of the switching IC 2 is normally electrically connected to the output terminal 14a through a conductive junction material. In this embodiment, the control circuit IC 3 is also joined in the similar manner. Specifically, as shown in FIG. 3, the control circuit IC 3 is connected to the grounding terminal 14b through a conductive layer 15.

The conductive layer 15 may be a conductive adhesive such as a solder or a silver paste. The resistance of the conductive layer 15 is preferably set to be 1 k$\Omega$ or less, and the capacitance formed between the control circuit IC 3 and the grounding terminal 14b due to the interposed conductive layer 15 is preferably set to 10 pF or more. As the control circuit IC 3 is joined to the grounding terminal 14b, the substrate potential of the control circuit IC 3 is stabilized to the ground potential GND.

The switching IC 2 is connected to the grounding terminal 14b through a thick wire 21. This thick wire 21 is connected to the emitter electrode (grounding electrode) of the IGBT 5 and a pad connected to the low potential side of the temperature sensor 7. Thus, the IGBT 5 and the temperature sensor 7 are grounded through the grounding terminal 14b. The gate electrode of the IGBT 5, the high potential side of the temperature sensor 7 and the low potential side of the temperature sensor 7 in the switching IC 2 are connected to the control circuit IC 3 through the bonding wires 20a, 20b and 20c, respectively.

The substrate potential of the control circuit IC 3 is grounded through the conductive layer 15. In fact, however, due to resistance of the substrate forming the control circuit IC 3, the control circuit IC 3 is grounded through the bonding wire 20c, switching IC 2, thick wire 21 and the grounding terminal 14b. Since the bonding wire 20b is susceptible to electromagnetic noise, the switching IC 2 and the control circuit IC 3 are located such that the bonding wire 20b is about 5 mm or shorter. In correspondence to the bonding wire 20b, the remaining bonding wires 20a and 20c are also set to be 5 mm or shorter.

The control circuit IC 3 is electrically connected to the protective resistor 3a through a bonding wire 20d and to an input terminal 14d through a bonding wire 20e to receive the ignition signal from the engine ECU 8. The protective resistor 3a is electrically connected to a constant voltage terminal 14d through a bonding wire 20f. This terminal 14d is connected to the power source 3b which supplies a constant power voltage +B.

In operation, when the ignition signal from the engine ECU 8 becomes high, the control circuit IC 3 applies a high level gate voltage to the IGBT 5 through the resistor 6. The IGBT 5 responsively turns on to allow current to flow in its collector-emitter path so that the coil current in the primary winding 4a of the ignition coil 4 increases and store electromagnetic energy.

When the ignition signal from the engine ECU 8 becomes low from high, the gate voltage of the IGBT 5 becomes so that the IGBT 5 responsively turns off to interrupt the coil current in the primary winding 4a. With this interruption of the coil current, the secondary winding 4b generates a spark voltage with which the spark plug 13a generates a spark discharge.

In the above operation, if the ignition signal from the engine ECU 8 remains high for a long period, the IGBT 5 continues to be turned on and generates heat. As a result, the temperature of the switching IC 2 rises in proportion to the continuation of the turning on of the IGBT 5. As the temperature rises, the forward voltage drop of the temperature sensor 7 decreases. When the forward voltage drop falls below the reference voltage thereby indicating that the IGBT 5 is continuing to be turned on for an excessive period, the overheat detector circuit 12 generates an output signal indicative of overheating. The gate driver circuit 10 responsively shuts off an application of the high level gate voltage to the IGBT 5 thereby turning off the IGBT 5. Thus, the overheating of the switching IC 2 is restricted.

In the above embodiment, the control circuit IC is joined to the grounding terminal 14b through the conductive layer 15. Therefore, the substrate potential of the control circuit IC 3 is stabilized to the ground potential and hence its circuit operation is stabilized. This advantage is described below in more detail.

Figure 4:
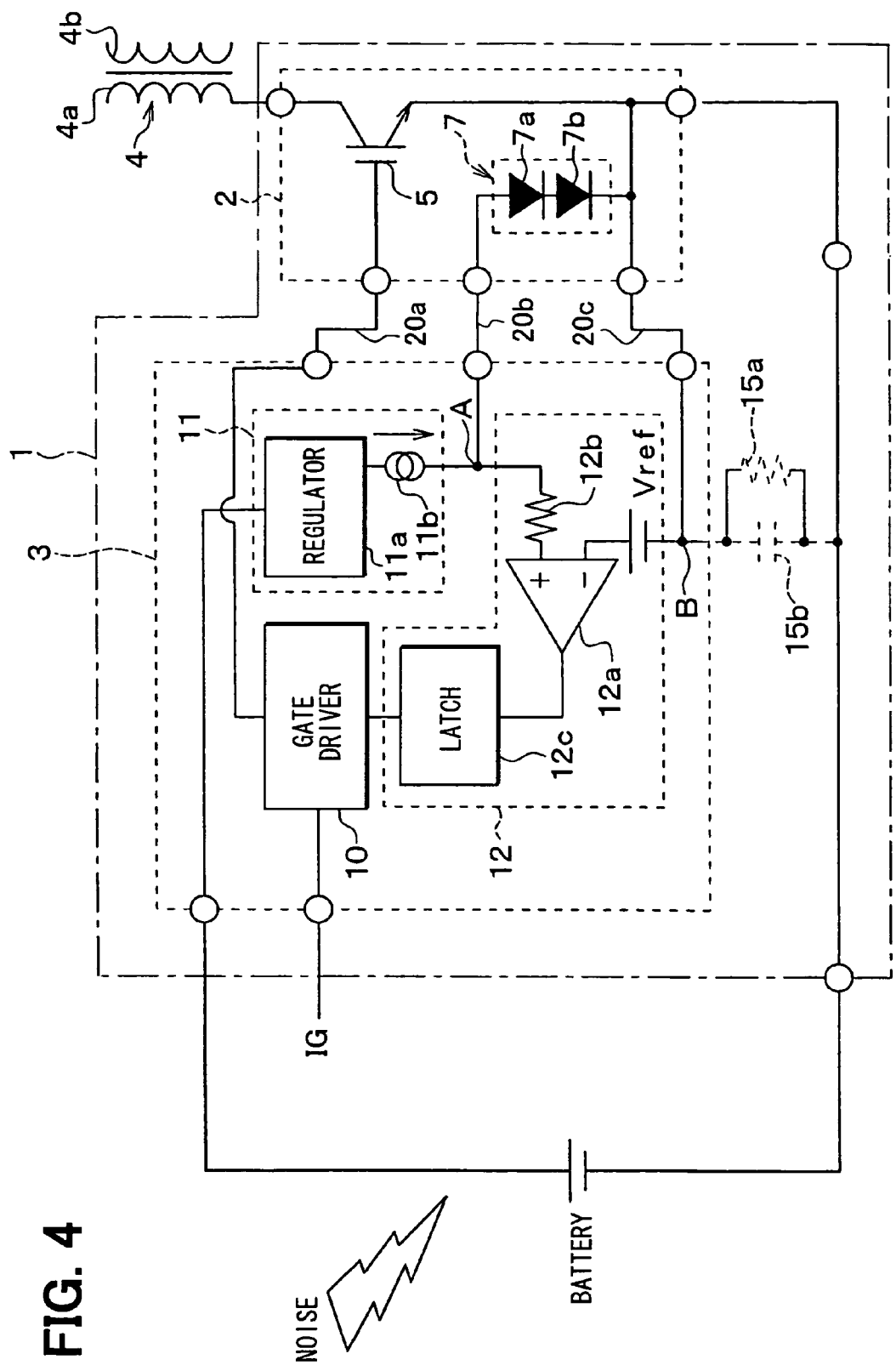
FIG. 4 is an electric circuit diagram of an equivalent circuit of the ignition device shown in FIG. 1.

The ignition device 1 shown in FIG. 1 is simulated to an electric equivalent circuit as shown in FIG. 4. The temperature sensor 7 is represented as two polysilicon diodes 7a and 7b. The current regulator circuit 11 is represented as a voltage regulator circuit 11a for supplying a regulated constant voltage and a constant current circuit 11b for supplying a regulated constant current based on the regulated constant voltage from the regulator circuit 11a. The overheat detector circuit 12 is represented as a comparator 12a, a resistor 12b and a latch circuit 12c. The comparator 12a compares a high potential side voltage appearing at a point A of the temperature sensor 7 and applied through the resistor 12b. When the comparator 12a generates a signal indicating overheating of the switching IC 2, the latch circuit 12c generates a command signal which causes the gate driver circuit 10 to stop turning on and off the IGBT 5 in response to the ignition signal IG.

Further, since the control circuit IC 3 is connected to the grounding terminal 14b through the conductive layer 15, the conductive layer 15 is represented as a resistor 15a and a capacitor 15b in phantom between a low potential side point B and the grounding terminal 14b. The resistor 15a and the capacitor 15b are preferably set to about 1 kΩ or less and about 10 pF or more, respectively. If the conductive layer 15 is not provided, the low potential point B is considered to be connected to the grounding terminal 14b without the resistor 15a and the capacitor 15b.

Figure 5A:
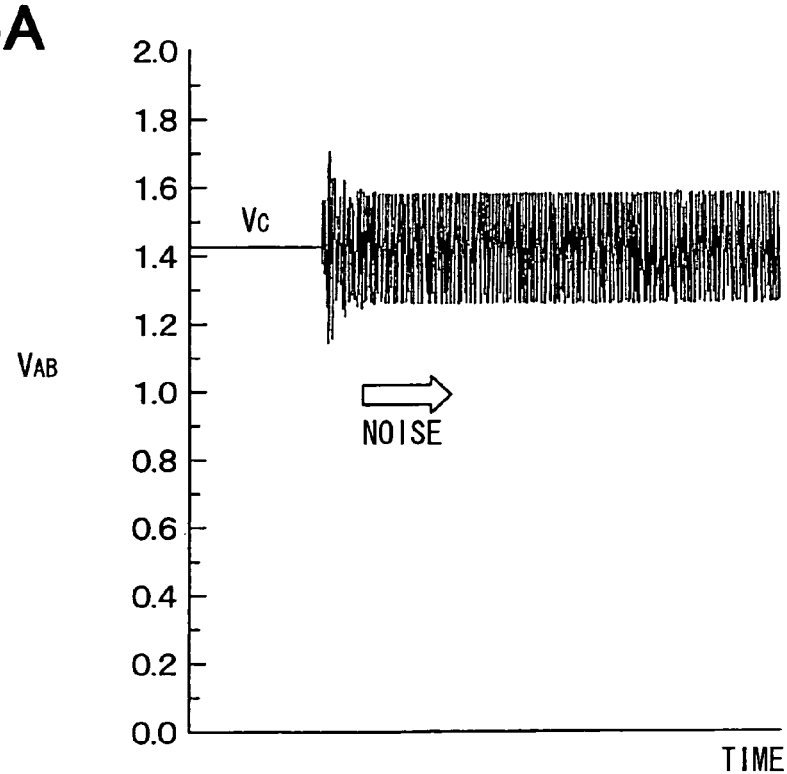
FIGS. 5A and 5B are charts of terminal voltages simulated as appearing in the ignition device in the case of the embodiment and the conventional art, respectively.

As an experiment, electromagnetic noises were applied to the ignition device 1, particularly to its battery wire, and the voltage VAB between the points A and B were measured. This voltage VAB corresponds to the forward voltage drop of the diodes 7a and 7b, which decreases as the temperature rises. The measured voltages VAB are shown in FIGS. 5A and 5B, which corresponds to a case that the conductive layer 15 is provided as in the above embodiment and a case that no conductive layer is provided as in the conventional device.

Figure 5B:
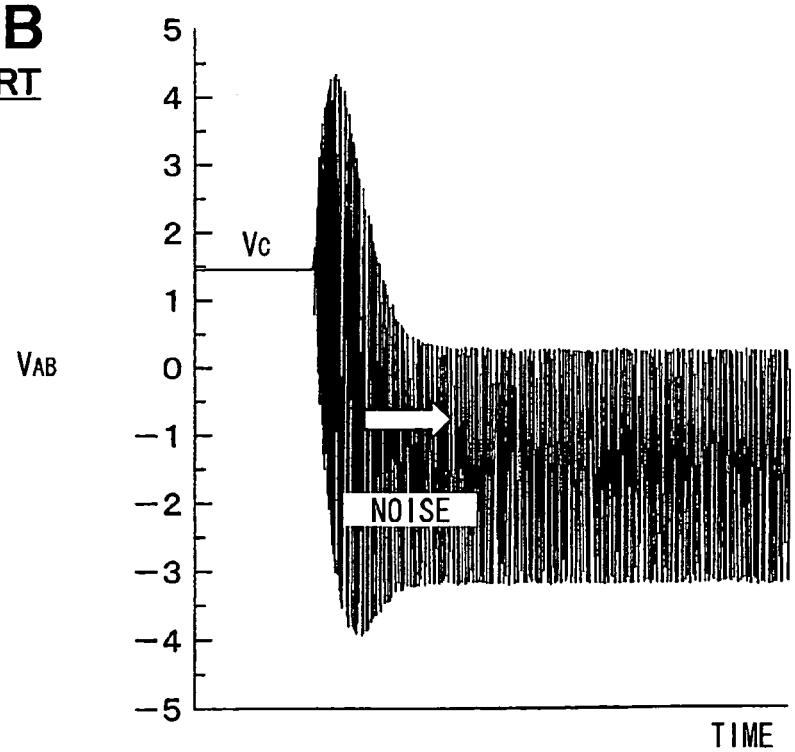

As understood from FIG. 5B (prior art), the voltage VAB not only largely fluctuated but also its center voltage Vc largely shifted to a lower voltage side (higher temperature side) from the forward voltage drop (Vf×2=1.4 V) of the two diodes 7a and 7b, as the noise application was continued. This shift may lead to erroneous detection of overheat followed by erroneous stopping of the IGBT operation. However, as understood from FIG. 5A (embodiment), the voltage VAB fluctuated less. Further, its center voltage Vc did not shift from the forward voltage drop (1.4 V), that is, the forward voltage drop of the diodes 7a and 7b is restricted from decreasing. Therefore, the erroneous detection of overheating and erroneous stopping of the IGBT operation are prevented even if the ignition device 1 is subjected to noise.

As a result, it is prevented that the spark plug 13 stops spark discharge due to noise even if the IGBT 5 is in the normal temperature range.

Further, in the above embodiment, the ignition device 1 was subjected to another test, in which the length of the bonding wires 20b and 20c were set to 5.5 mm and 5.0 mm. In the case of 5.5 mm wires, the temperature sensor 7 operated erroneously due to electromagnetic noise. In the case of 5.0 mm, however, the temperature sensor 7 did not operate erroneously under the same noise application condition. For this reason, the bonding wires of about 5.0 mm or less are preferred to maintain the spark discharge of the spark plug 13 as far as the IGBT temperature is normal even under the noise-applied condition.

It is noted in the above embodiment that the IGBT 5 may be replaced with other semiconductor switching elements such as a MOS transistor. Further, the present invention should not be limited to an ignition device but may be applied to other power switching control devices for electric systems, which use semiconductor switching element and stop switching operation upon detection of overheating.

What is claimed is:

1. A power switching control device comprising:
    a switching IC including a semiconductor power switching element, which turns on and off supply of coil current to an ignition coil, the switching IC including a temperature sensor constructed with at least one diode for detecting temperature of the switching IC;
    a control circuit IC provided in a chip form separate from the switching IC for outputting a control signal to turn on and off the switching element, the control circuit IC generating the control signal in response to an ignition signal applied thereto, the control circuit IC including an overheat detector circuit for detecting an overheating of the switching IC based on a detection result of the temperature sensor and controlling the control signal to stop an operation of the switching element upon detection of the overheating;
    a bonding wire connecting the temperature sensor and the overheat detector circuit;
    a grounding terminal grounding the switching element and the temperature sensor, the grounding terminal further grounding the overheat detector circuit through the bonding wire and the switching IC; and
    a conductive layer provided between the control circuit IC and the grounding terminal to join the control circuit IC to the grounding terminal.

2. The power switching control device according to claim 1, wherein the conductive layer is a solder.

3. The power switching control device according to claim 1, wherein the conductive layer is a conductive adhesive.

4. The power switching control device according to claim 1, wherein the diode is a polysilicon diode and formed on the switching IC.

5. The power switching control device according to claim 1, wherein the overheat detector circuit compares a terminal voltage of the temperature sensor with a predetermined voltage and detects the overheating when the terminal voltage becomes smaller than the predetermined voltage.

6. The power switching control device according to claim 1, wherein the grounding terminal is formed as a terminal of a lead frame.

7. The power switching control device according to claim 1, wherein the bonding wire is shorter than 5 mm in length.

8. A power switching control device comprising:
    a switching IC including a semiconductor power switching element, which turns on and off supply of coil current to an ignition coil, the switching IC including a temperature sensor constructed with at least one diode for detecting temperature of the switching IC;

a control circuit IC provided in a chip form separate from the switching IC for outputting a control signal to turn on and off the switching element, the control circuit IC generating the control signal in response to an ignition signal applied thereto, the control circuit IC including an overheat detector circuit for detecting an overheating of the switching IC based on a detection result of the temperature sensor and controlling the control signal to stop an operation of the switching element upon detection of the overheating;

a bonding wire connecting the temperature sensor and the overheat detector circuit; and a grounding terminal grounding the switching element and the temperature sensor, the grounding terminal further grounding the overheat detector circuit through the bonding wire and the switching IC, wherein the bonding wire is shorter than 5 mm in length.

9. A power switching control device comprising:

a switching IC including a semiconductor power switching element, which turns on and off supply of current to an electric system, the switching IC including a temperature sensor for detecting temperature of the switching element;

a control circuit IC distanced from the switching IC for controlling operation of the switching element, the control circuit IC including an overheat detector circuit for detecting an overheating of the switching IC based on a detection result of the temperature sensor and stopping the operation of the switching element upon detection of the overheating;

bonding wires connecting the switching IC and the control circuit IC to each other;

a grounding terminal for grounding both the switching IC and the control circuit IC; and a conductive layer provided between the control circuit IC and the grounding terminal and joining the control circuit IC to the grounding terminal thereby grounding the control circuit IC.

10. The power switching control device according to claim 9, wherein the conductive layer has resistance of less than 1 kΩ and capacitance of more than 10 pF.

11. The power switching control device according to claim 9, wherein the bonding wires are shorter than 5 mm in length.

12. The power switching control device according to claim 9, wherein the switching element is a vertical-type IGBT, and the temperature sensor includes a plurality of diodes provided to be responsive to temperature of the IGBT.

* * * * *